United States Patent [19]
Van Den Bout et al.

[11] Patent Number: 5,537,295
[45] Date of Patent: Jul. 16, 1996

[54] UNIVERSAL RECONFIGURABLE PRINTED CIRCUIT BOARD

[75] Inventors: David E. Van Den Bout, Apex, N.C.; Harry L. Tredennick, Los Gatos, Calif.

[73] Assignee: Altera Corporation, San Jose, Calif.

[21] Appl. No.: 206,774

[22] Filed: Mar. 4, 1994

[51] Int. Cl.$^6$ .................................................. H05K 7/10
[52] U.S. Cl. ........................ 361/767; 361/760; 361/781; 361/783; 439/74; 439/75; 439/68
[58] Field of Search .................................... 174/260, 250, 174/253, 255, 261; 257/700, 723, 725; 361/752, 760, 767, 774, 775, 777, 778, 781, 783, 807, 822, 823; 439/48–54, 68, 85, 516, 69–73, 74, 75; 364/929.4, 926.91, 935.2; 395/325, 250, 425, 500, 800

[56] References Cited

U.S. PATENT DOCUMENTS 5,257,166  10/1953  Marui et al. ............................ 361/760

FOREIGN PATENT DOCUMENTS 0405765  1/1991  European Pat. Off. ............... 361/760

OTHER PUBLICATIONS

*Anyboard: An FPGA–Based Reconfigurable System*, by David E. Van den Bout, et al., IEEE Design & Test of Computers, Sep., 1992.

*The 1993 Anyboard Rapid–Prototyping Environment*, by Dr. David E. Van den Bout, et al., 4th Intl. Workshop on Rapid System Prototyping (IEEE), Jun. 30, 1993.

*The Anyboard: A Rapid–Prototyping System for use in Teaching Digital Circuit Design*, by Thomas A. Petersen, et al., 1st Intl. Workshop on Rapid System Prototyping (IEEE), Jun. 4–7, 1990.

*IQ160 Field Programmable Interconnect Device*, I–Cube Design Systems, Inc.

*Product Announcement of X–12 Reconfigurable Logic System*, National Technologies, Inc.

Primary Examiner—Donald A. Sparks
Attorney, Agent, or Firm—Townsend and Townsend and Crew

[57] ABSTRACT

A universal reconfigurable printed circuit board that provides multiple sockets that can receive field reprogrammable logic devices, hard-wired interconnection circuits, or field reprogrammable interconnection devices interchangeably. Optimized interconnection topologies provide a large number of options for a variety of applications. A versatile interface circuit is used to interface with a personal computer bus during board configuration, and then can be reconfigured to perform application-specific functions.

23 Claims, 6 Drawing Sheets

UNIVERSAL RECONFIGURABLE PRINTED CIRCUIT BOARD

BACKGROUND OF THE INVENTION

This invention relates in general to printed circuit boards, and in particular to a reconfigurable printed circuit board for field programmable devices.

Printed circuit boards (PCBs) facilitate rapid construction of electronic circuits by providing a stable insulating sheet of material upon which circuit components are mounted. The components are typically interconnected using thin plated conductive (e.g. copper) lines bonded to the sheet that form circuit paths. A large variety of PCBs has been developed for many different applications.

Field programmable devices (FPDs) are circuits that include a large number of gates whose interconnection can be programmed to form a desired logic function. Utilizing any one of a variety of reprogrammable technologies, FPDs allow engineers to electrically program (and reprogram) standard, off-the-shelf logic elements to meet the specific needs of their application. Thus, FPDs combine the logistical advantages of standard, fixed integrated circuits with the architectural flexibility of custom devices. For the purposes of this description, it is to be understood that a programmable device refers to once programmable as well as reprogrammable devices.

Larger and more complex circuits can be developed by combining and interconnecting several FPDs on a PCB. A growing field of application for such boards is design and rapid implementation of prototypes for larger systems such as a microprocessor. Using computer aided design (CAD) tools and versatile FPD-based PCBs designers can develop, in a matter of hours, digital systems containing thousands of gates.

One example of an FPD-based PCB is the "Anyboard" developed at North Carolina State University. The Anyboard consists of a hardware card that incorporates six FPDs (more specifically field programmable gate arrays, or FPGAs), three random access memory (RAM) chips, buffers and local and global buses that connect the FPGAs to the RAMs and buffers. A complete description of the Anyboard system can be found in "Anyboard: An FPGA-based, reconfigurable system," IEEE Design & Test of Computers, pages 21–30, September, 1992, by Van den Bout et al.

While FPD-based PCBs such as the Anyboard provide great flexibility in terms of the variety of circuits that can be developed, to the extent that the architecture of the board is fixed in hardware the application of the board is limited. In case of the Anyboard, for example, the number of FPGAs and RAMs as well as the bus interconnection are fixed in hardware. Improvements have been proposed on the architecture of the Anyboard that require incorporating field programmable interconnect devices (FPIDs) onto the Anyboard. The FPIDs help mitigate the limitations due to fixed bus interconnects. However, a drawback of using FPIDs is the increase in bus delays which limits the speed of the final product.

There is therefore a need for a highly flexible and fast FPD-based universal circuit board with reconfigurable architecture.

SUMMARY OF THE INVENTION

The present invention offers an FPD-based universal circuit board (UCB) with reconfigurable architecture. The UCB provides a plurality of sockets adapted to receive FPDs or FPIDs interchangeably. The sockets are interconnected in several interconnection topologies using multi-bit buses. For applications requiring large amounts of data or function lookup tables, the UCB further incorporates on-board memory. The UCB further provides the option of using selective shorting circuits (SSCs) for hard-wired interconnection in place of FPIDs.

Accordingly, in one embodiment, the present invention provides a reconfigurable universal circuit board (UCB) that includes a plurality of sockets interconnected via a network having local buses that interconnect pairs of sockets, and a global bus that interconnects all of the sockets together, and an interface circuit connected to the global bus for providing interface to external circuitry. The sockets and the interconnection network of the UCB of the present invention are adapted to enable the sockets to interchangeably receive any one of a field programmable device, field programmable interconnect device, selective shorting circuits, or any other integrated circuit chip. The UCB further provides for on-board memory for data storage purposes.

A better understanding of the nature and advantages of the reconfigurable universal circuit board of the present invention may be had with reference to the description and diagrams below.

DESCRIPTION OF SPECIFIC EMBODIMENTS

Several factors aimed at optimizing flexibility underlie the design of the UCB of the present invention. To achieve highest flexibility the UCB provides for arbitrary interchangeability among FPDs, FPIDs and SSCs for each socket. This will enable the user to customize the board architecture to suit the largest number of applications. The number of full sockets on the UCB depends upon the particular application. A larger number of FPDs is required to support complex, logic intensive applications. However, more sockets result in increased hardware, larger or multiple boards and higher cost. To provide for optimum logic density on a single board the size of a PC-AT card, the UCB includes, for example, eight sockets. This allows the use of up to eight FPDs. With eight powerful FPDs such as the FLEX EPF81188 programmable logic device (PLD) developed by Altera Corporation of San Jose, Calif., the UCB can readily support highly complex applications. For higher reconfigurability, one or more FPDs can be replaced with FPIDs such as the IQ160 developed by I-Cube Design Systems Inc., to provide for programmable rerouting of connections between the FPDs.

Interconnection Topology

Figure 1A:
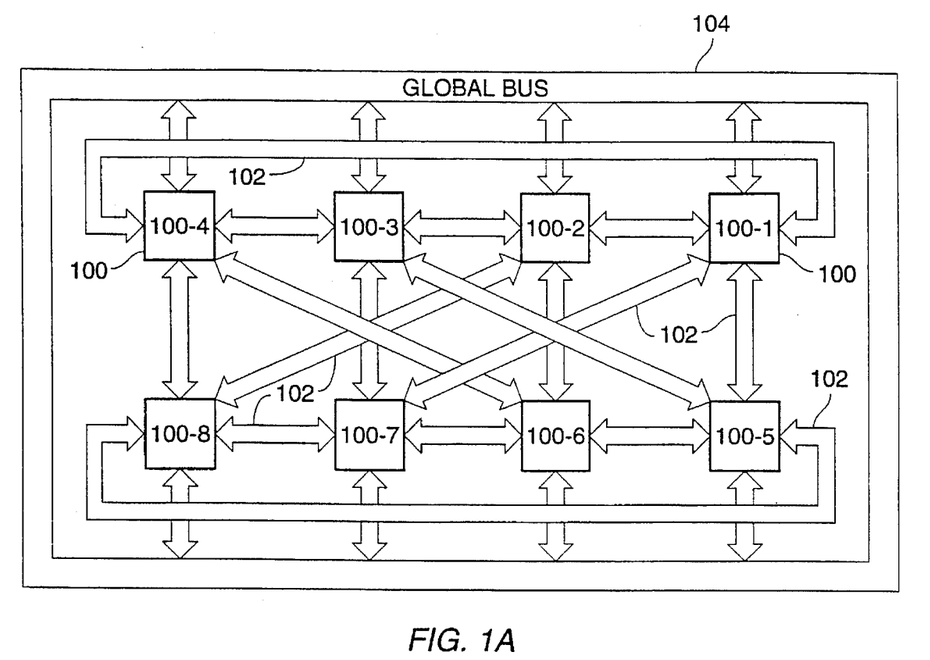
FIGS. 1A, 1B and 1C illustrate three optimized interconnection topologies for an exemplary UCB architecture.
Figure 1B:
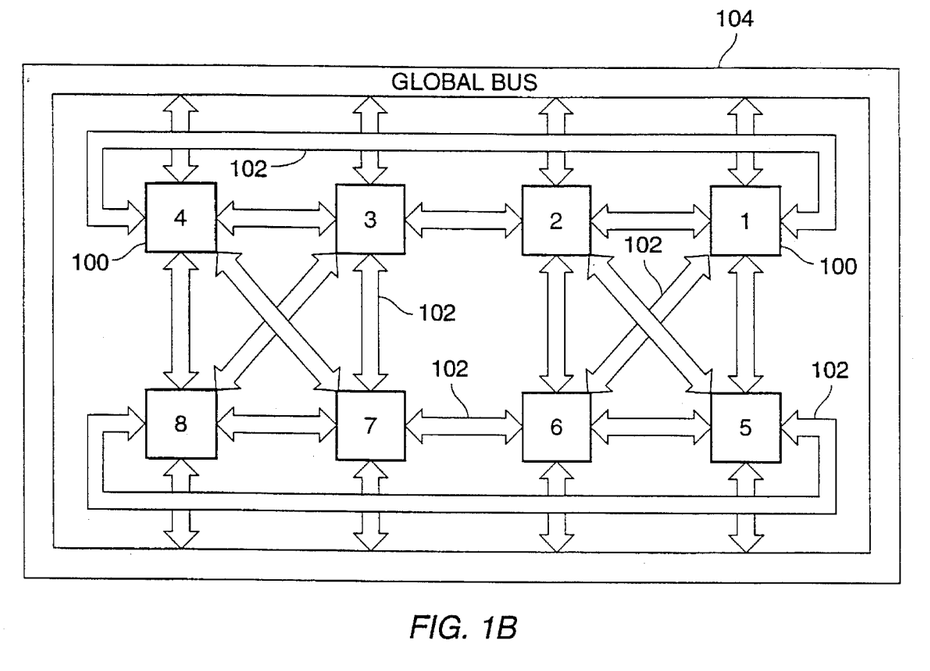
Figure 1C:
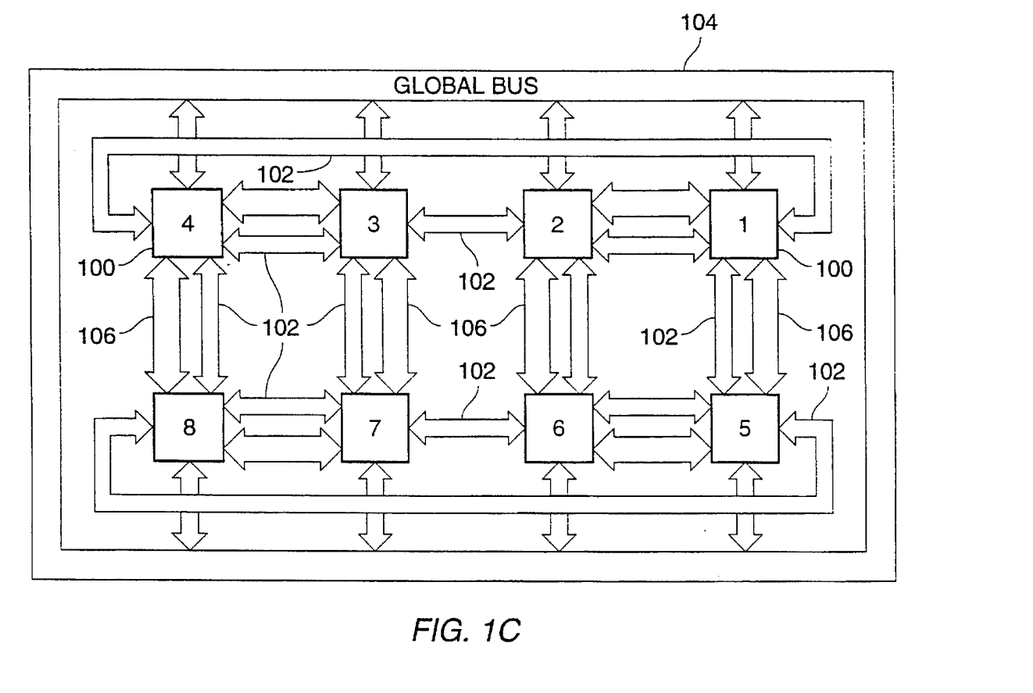

Interconnection topology is another important factor in optimizing flexibility. FIGS. 1A, 1B and 1C show three different examples of interconnection topologies for the UCB of the present invention. In these examples, each board includes eight sockets 100, local buses 102 that run between pairs of sockets 100 and a single global bus 104 that interconnects all the sockets 100. The local buses 102 as well as the single global bus 104 are preferably 32-bit buses. In each topology, the sockets 100 are arranged in an array of two rows of four sockets each. The topology in FIG. 1A (topology #1) is a bipartite graph with sockets {100-1, 100-3, 100-6, 100-8} in one partition and sockets {100-2, 100-4, 100-5, 100-7} in the other partition. Each socket 100 in a given partition has a 32-bit bus 102 going to every socket 100 in the other partition, but no socket 100 has a 32-bit bus 102 connecting it to a socket 100 within its own partition. This excludes the 32-bit global bus 104. The topology shown in FIG. 1B (topology #2) has dual 4-cliques of sockets 100 and each socket 100 in a clique is connected to its equivalent socket 100 in the other clique. The topology shown in FIG. 1C (topology #3) has dual squares where each socket 100 in a square is connected to the adjacent socket 100 by a bus 106. Each socket 100 in a square is connected to its equivalent socket 100 in the other square by a 32-bit bus 102. In topologies shown in FIGS. 1A and 1B, each socket has a direct 32-bit connecting bus to four other sockets. Since the topology shown in FIG. 1C requires each socket to connect to only three other sockets directly, there is a an extra 32-bit bus for each pair of sockets. Therefore, in this topology the buses 106 can be made 16 bits wide.

The UCB of the present invention provides four different options for each one of the eight sockets. Each socket can receive an FPD, or an FPID, or a hard-wired interconnection pattern, or it may be unused (i.e., empty). Plugging a hard-wired interconnection pattern such as an SSC into a socket is equivalent to placing a programmed FPID into the same socket except that the wiring delay will be decreased. Therefore, there are actually three distinct options for each of the eight sockets. This results in $3^8$=6,561 variations on each of the three topologies. To determine which of the variations provides the highest performance and greatest flexibility, a computer program was written to generate all 6,561 variants of each topology. As a measure of flexibility and performance, the main criterion was the total number of FPD input/output (I/O) pins that can communicate with each other. This metric emphasizes topological variants which have a lot of FPDs to maximize the number of FPD I/O pins, with some strategically placed FPIDs to maximize the number of possible connections between FPD I/O pins. This metric ignores blocking where communication bottlenecks prevent a given I/O pin from connecting to all the other I/O pins it can possibly connect to. A second criterion was the total number of FPD I/O pins that could be interconnected taking into account blocking conditions. The results of the program indicate that, when using for example the Altera FLEX EPF81188 PLD and IQ160, topology #1 provides for the best overall reach (i.e., number of I/O pins reached by any given I/O pin) and total I/O, averaging 490 and 120, respectively. Topology #2 is a close second with an average of 458 and 117, while topology #3 is significantly less flexible averaging 284 and 109.

Topology #1 achieves the highest performance as a result of having buses that connect distant sockets (such as 100-4 and 100-6). The slightly lower performance of topology #2 is due to denser local connections and fewer long-distance connections. The relatively poor performance of topology #3 is due to having mostly local I/O connections. Thus, from a theoretical standpoint, topology #1 is preferable. From a practical standpoint, however, the multiple long distance buses of topology #1 result in a more complex layout. Using wireability as a criterion, topology #3 is clearly the most straightforward, followed distantly by topology #2 and topology #3. In many applications, therefore, topology #2 may be the best alternative since it has good reach and total I/O while retaining relatively local buses. For the purpose of the rest of this description, however, topology #1 will be used as the preferred interconnection topology.

UCB Architecture

Figure 2A:
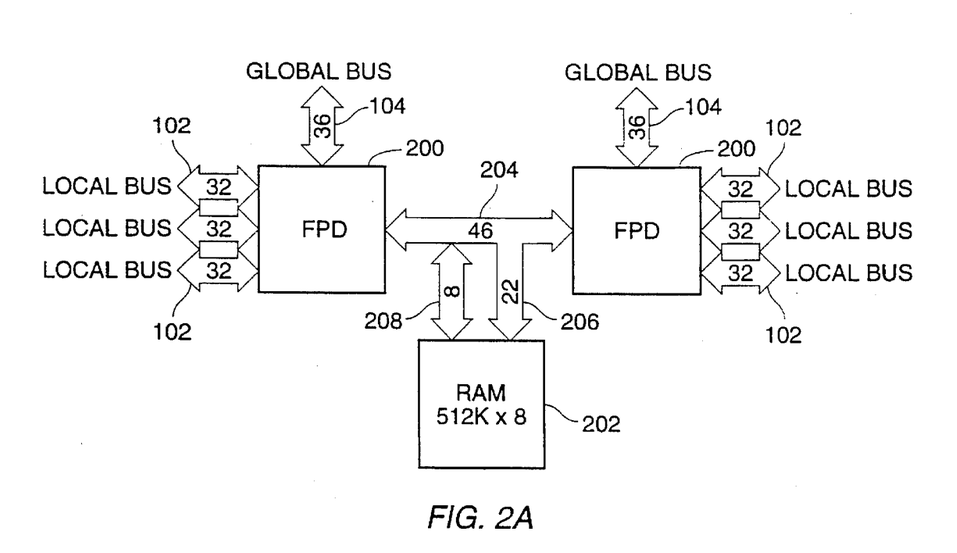
FIGS. 2A and 2B show high level views of an exemplar architecture using two FPDs and a RAM.

A large number of applications require large amounts of data or function lookup tables. The UCB of the present invention provides on-board memory in the form of, for example, random access memory (RAM) to meet this requirement. FIG. 2A shows a high level view of an exemplar architecture using two FPDs 200 and a RAM 202. The same reference numerals are used to refer to those elements that are common to both FIGS. 1A and 2A. The example shown in FIG. 2A uses the Altera FLEX EPF81188 which has 180 usable I/O pins for the FPDs and a 512K×8 SRAM for the memory 202. In this example, each FPD includes a 36-bit global bus 104, three 32-bit local buses 102 and a fourth local bus 204 that is 46 bits wide. The 512K×8 SRAM 202 communicates with the 46-bit local bus 204 via a 22-bit bus 206 and a separate 8-bit bus 208. This arrangement is replicated in each pair of sockets ({100-1, 100-2}, {100-3, 100-4}, {100-5, 100-6}, {100-7, 100-8}, in FIG. 1A).

The 46 wires of the local bus 204 can be used to transfer data between the FPDs 200 and access the RAM 202. Either one of the FPDs 200 can generate the address and control signals, and use the RAM 202 data. Clearly, when the 30 wires that control the RAM 202 are in use, the FPDs 200 can only communicate over the remaining b 16wires. Among the advantages of this architecture are: (1) either FPD 200 can use the RAM 202; (2) one FPD 200 can use the RAM 202 data while the other generates addresses; and (3) if the RAM 202 is not used, the wires used to address the RAM 202 and access its data can be used for inter-FPD communication.

Figure 2B:
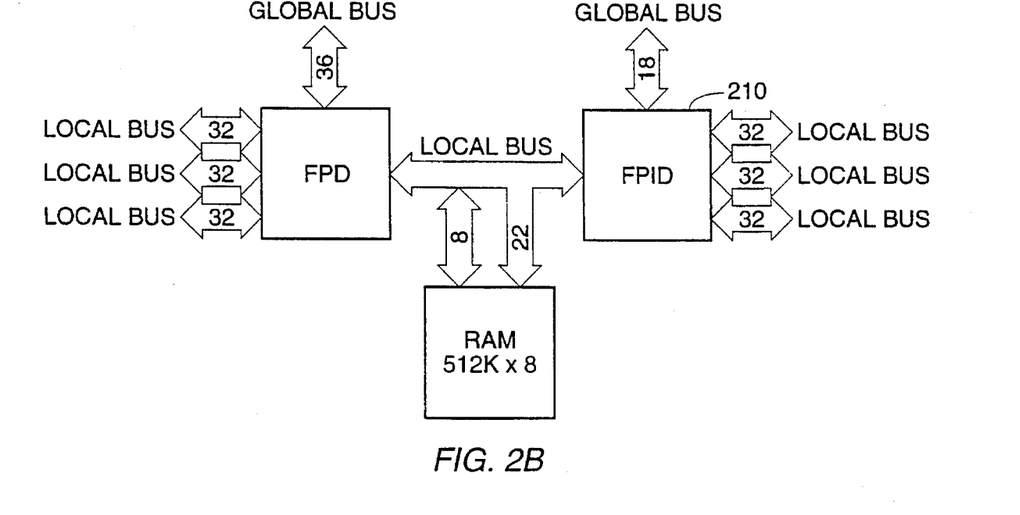

One or both FPDs 200 can be replaced with an FPID or a hard-wired interconnection circuit. An example of local interconnections for this case is shown in FIG. 2B. In this example, an IQ160 (FPID) 210 is used instead of one of the FPDs 200. The only change as compared to the arrangement shown in FIG. 2A is that the IQ160 210 only connects to 18 wires of the global bus 104 since it has only 160 I/O pins as compared to the 180 I/O pins of the FLEX EPFS1188. Since the FPID 210 serves mainly to route connections from one FPD 200 to another, and since the global bus 104 already interconnects all the FPDs 200, it would seem redundant to connect the FPID 210 to the global bus 104. But, by connecting the FPID 210 to the full local bus it becomes possible for any FPD 200 to address and access any RAM 202 on the UCB.

Figure 3:
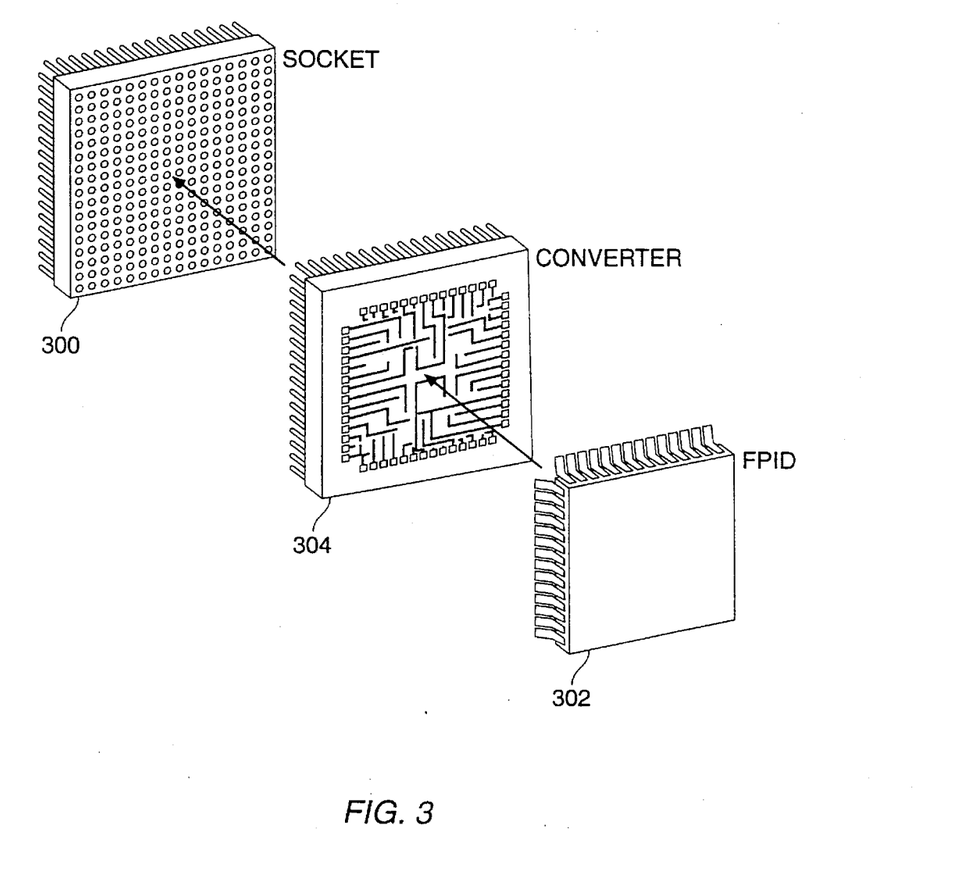
FIG. 3 illustrates an exemplary socket-adapter-part structure.

The interchangeability of FPDs and FPIDs in the same socket is made possible by adapters. The UCB of the present invention allows an adapter to be used for plugging, for example, an IQ160 part into a socket intended for, for example, a FLEX EPF81188 part. The adapter is a mini-circuit board that can transform the pin-out of a particular package into another pin-out. FIG. 3 illustrates an exemplary socket-adapter-part structure. The socket 300 is designed to receive an FPD such as the FLEX EPF81188. To enable the socket 300 to receive a part 302 such as the IQ160 that has a different pin-out, an adapter 304 is first inserted into the socket 300. The adapter 302 converts the IQ160 footprint to the FLEX EPF81188 footprint. The IQ160 302 then mounts the adapter 304. An example of a commercially available adapter is the "Correct-A-Chip" developed by Aries.

No adapters are required when hard-wired interconnection circuits or selective shorting circuits (SSCs) are used. In this case, a multi-layered interconnection circuit that directly connects preselected I/O pins is inserted into the socket 300. The advantage of using an SSC is that the delays caused by the programmable interconnection devices are eliminated. The IQ160, for example, introduces a delay of approximately 17 ns in the signal path. However, the user can no longer program interconnections. Therefore, SSCs are preferably used in applications where flexibility can be compromised to achieve higher speed and lower cost.

External Interfaces

Figure 4:
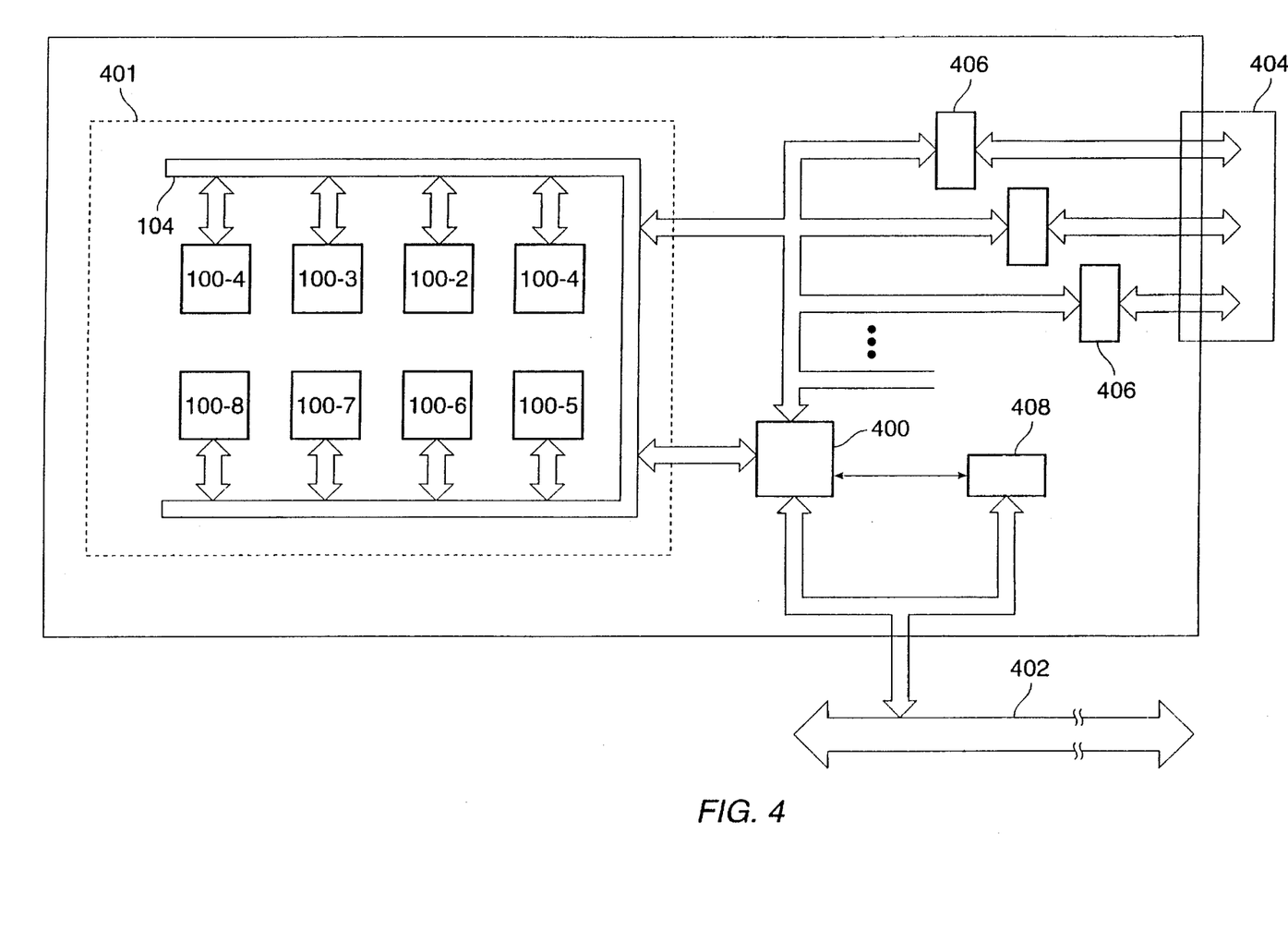
FIG. 4 is a simplified diagram showing the external interfaces to the UCB.

To enable the users to configure the UCB, the board provides for interface to a personal computer (PC). A separate interface is provided to the outside world to enable the UCB to act as, for example, a data acquisition device (i.e., perform data collection functions). To facilitate the two interfaces, the UCB includes an additional FPD such as the Altera FLEX8452. FIG. 4 is a simplified diagram showing the external interfaces. The global bus 104 that connects the eight sockets 100 also connects to an FPD 400. The FPD 400 provides an interface between the UCB and a PC bus 402. The connection to the outside world is made through a multi-pin connector 404 such as an 80-pin nanoconnector. The FPD 400 also controls bus transceivers 406 that buffer signals entering and exiting the UCB through the connector 404. A secondary FPD 408, such as the Altera EP330, connects to the FPD 400 and acts as a bootstrap loader to configure the FPD 400. The secondary FPD 408 provides logic that allows the FPD 400 to be reconfigured through the PC bus 402. Thus, the FPD 400 can be configured once to allow downloading of application configurations for the main FPD/FPID array 401, and then it can be reconfigured again for the particular interface that is needed by the downloaded application. This has several advantages. First, a separate dedicated memory is no longer required for storing the interface configuration for the FPD 400. Second, an application can configure the interface to fit its needs, rather than try to work around a fixed interface that might be provided in, for example, a read only memory (e.g., EPROM). Further, the interface configuration can be easily updated by the UCB manufacturer or the end user through a PC without having to physically access the UCB. Once the application starts to run (i.e., user mode), the FPD 400 no longer has to store the downloading interface. This provides extra programmable logic that can be used for other purposes including building a custom interface for the application. The FPD 400 can also be utilized for other purposes such as clock generation. For example, the Altera FLEX8452 can receive independent clock signals through the PC bus 402, the external interface 404, and an on-board clock source. The user can program the FLEX8452 to output multiple clock signals to the FPDs 200 derived from any combination of these clock sources. This provides the user great flexibility in designing a clocking strategy for the UCB.

The inclusion of the two FPDs 400 and 408 also makes it possible to use the UCB without the FPD/FPID array 401. Such a stripped-down UCB would still allow the user to program the FPD 400 and communicate with it through the PC bus or the external nanoconnector. In fact, this arrangement provides more logic capacity than the typical introductory boards offered by FPGA manufacturers. A low-cost, stripped-down version of the UCB can thus be offered for smaller applications. As the user becomes more sophisticated and the application exceeds the capabilities of a single FPD, the UCB can be readily expanded by adding more FPDs and FPIDs.

Reconfiguring the UCB

Loading an application into the UCB through the PC bus includes the following steps. First, the FPD 400 is configured with the standard downloading interface by the secondary FPD 408. Upon completing the initialization, the FPD 400 will drive the configuration controls for the FPD/FPID array 401. The eight sockets 100-1 to 100-8 may carry either an FPD 200 or FPID 210. Selecting one FPD 200 at a time, the FPD 400 passes the configuration data bytes from the PC bus 402 to the global bus 104 where they will be strobed into the selected FPD 200. The process will be repeated for the next FPD 200.

After configuring the FPDs 200, the FPIDs 210 will be configured through their interface. The IQ160, for example, uses industry standard JTAG interface. Selected FPIDs 210 receive signals that place them in a state where they will accept downloading instructions. By deselecting the FPDs 200, they will be kept off-line while the FPIDs 210 receive configuration data. Depending on what type of FPID 210 is used, they may be configured in parallel. In case of the IQ160, for example, each socket carrying an IQ160 receives the configuration data via chip select (CS) and ready (RDY) lines supplied by FPD 400. Once the FPIDs 210 are configured, the FPDs 200 can enter the user mode. At this point the user has the option of reconfiguring the FPD 400 with the custom interface required by the application.

Two examples of applications for the UCB of the present invention are described hereinafter.

Application Example 1: Neural Networks

The basic calculation involved in neural networks is:

$$a_i = \sum_{j=1}^{N} x_j w_{ji} \quad (1)$$

$$x_i = \frac{1}{1 + e^{a_i}} \quad (2)$$

Figure 5A:
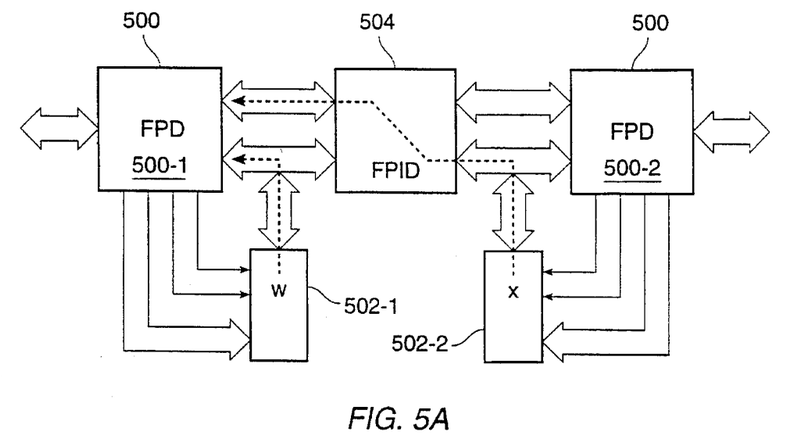
FIGS. 5A, 5B and 5C illustrate an application example for the UCB of the present invention implementing a neural network.
Figure 5B:
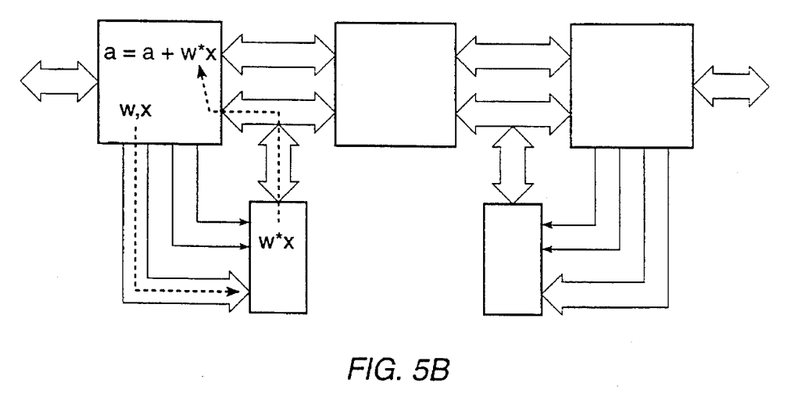
Figure 5C:
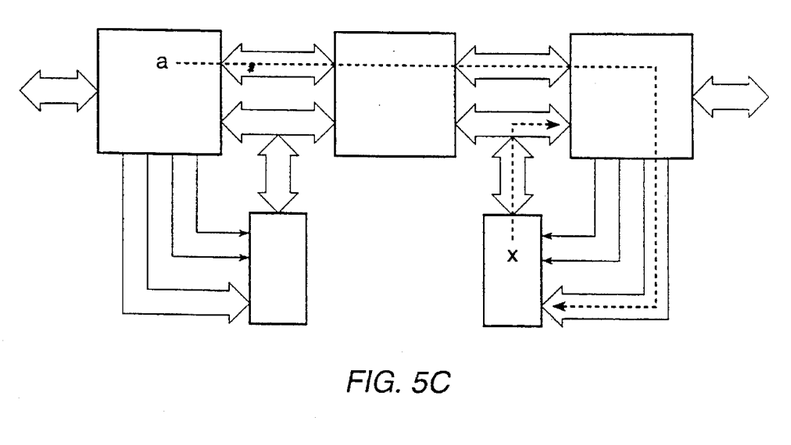

FIGS. 5A, 5B and 5C show the implementation of equation (1) and operation of the UCB using two of the FPDs 500-1 and 500-2 on the UCB. The $x_j$ neuron output values are stored in one RAM 502-1 and the $w_{ji}$ synaptic weights are stored in a second RAM 502-2. In FIG. 5A, the FPID 504 is configured so that FPD 500-1 receives both the weight and the neuron output. These values are concatenated and passed as an address to the RAM 502-1 as shown in FIG. 5B. The RAM 502-1 is pre-loaded with a multiplication table so that $(w_{ji}, x_j)$ will address the proper result. Only 128K RAM locations are needed to store this table since 7-bit and 12-bit precision are sufficient for $x_j$ and $w_{ji}$, respectively, and the sign bits can be removed form the address and the sign restored in the result after it enters the FPD.

The result of the multiplication is added to an internal accumulator for $a_i$. The steps shown in FIGS. 5A and 5B are repeated N times with the address generators in each FPD 500 stepping through the appropriate RAM locations. Then in the last step shown in FIG. 5C, the $a_i$ value is passed to FPD 500-2 and used as an address into a table of values for $$\frac{1}{(1+e^{a_i})}$$

that is stored in RAM 502-2. The output of RAM 502-2 is the new value of $x_i$ which will then be stored back into the RAM.

Using four FPDs 500, the UCB can evaluate two independent neural networks simultaneously. The speed of calculation is limited only by the RAM access time. Given a, for example, 40 ns RAM, the UCB would be capable of performing 50,000,000 connections per second.

Application Example 2: Microprocessor Emulation

Figure 6:
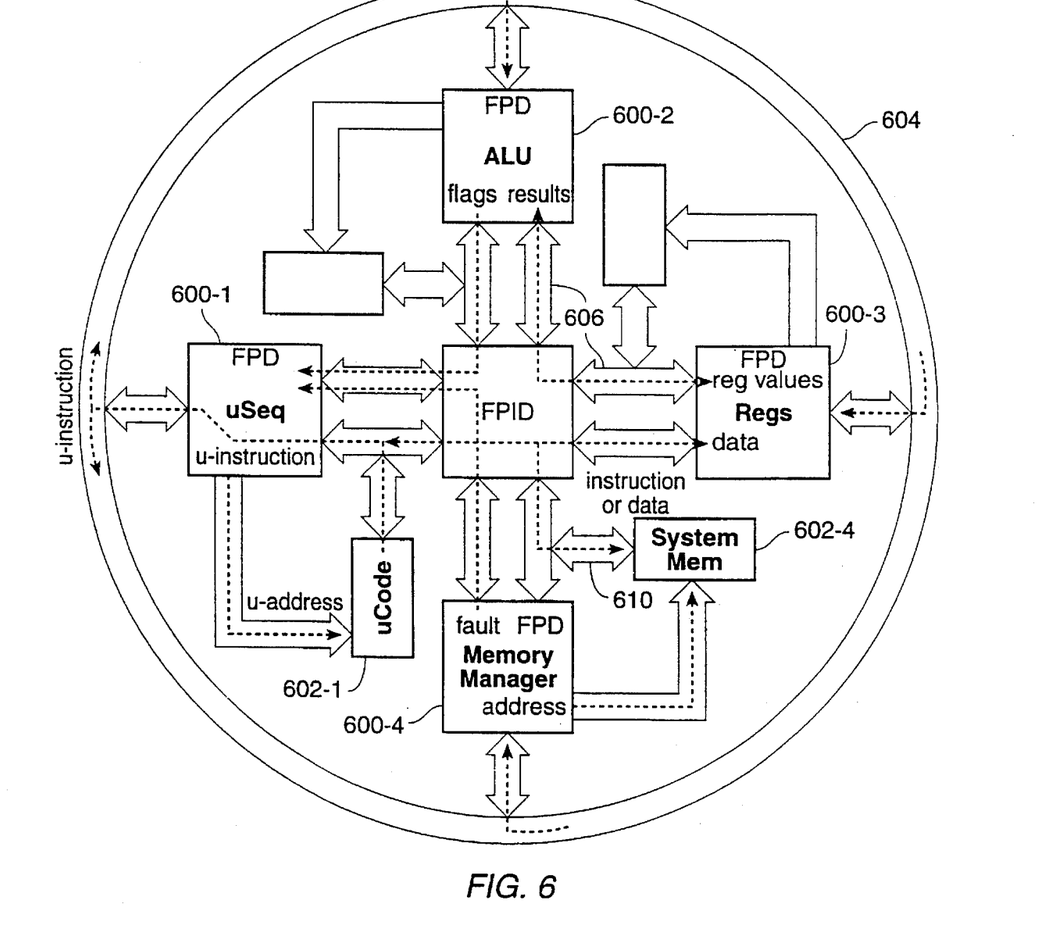
FIG. 6 illustrates another application example for the UCB of the present invention implementing a microprocessor.

FIG. 6 shows a high-level implementation and operation of a microprocessor using the UCB of the present invention. Four FPDs 600-1, 600-2, 600-3 and 600-4 are used to emulate a microsequencer, an ALU, register set, and memory manager, respectively. The microsequencer FPD 600-1 reads microinstructions from its attached RAM 602-1. Assuming a 16-bit wide RAM, it takes four cycles to read an entire 64-bit microinstruction. These microinstructions are broadcast over a 64-bit wide global bus 604 to other microprocessor blocks.

The ALU and register set FPDs 600-2 and 600-3 perform the operations requested by the microinstructions. Operands and results are passed through a single 16-bit bus 606 that connects the ALU and the register set. By multiplexing the bus 606 over the four cycles needed to fetch each new instruction, it will effectively act as a 32-bit bus.

The memory manager 600-4 uses its attached RAM 602-4 to emulate system memory. Once again, the four cycle microinstruction fetch time allows the 16-bit system memory bus 610 to be multiplexed into two 32-bit buses. Therefore, an instruction and an operand can be fetched every instruction cycle. The operand is passed to the register set 600-3 while the instruction is fed to the microsequencer 600-1. The new instruction, ALU flags, and memory fault information can be used to start the next instruction cycle for the processor. The RAM access time is the only speed limitation. Given a 40 ns RAM and full 64-bit microinstructions, the UCB can emulate a 6.25 MIPS microprocessor.

The above description and application examples contemplate employing any one of FPDs, FPIDs, or SSCs interchangeably in any one of the sockets of the UCB. However, because the pin-out for the sockets and the interconnect architecture of the UCB are not specialized for a specific application, adapters can be used to enable a socket to receive any other type of integrated circuit chip or system of chips. All that would be required is an adapter similar to the one used for the FPID shown in FIG. 3, and the UCB can receive any chip. For example, a microprocessor and several memory chips mounted on a separate small board can connect to the UCB via a connector adapted to fit into one of the UCB sockets. The microprocessor would then send and receive data to the FPDs and FPIDs on the UCB. Another typical example includes a floating-point coprocessor mounted on an adapter so that it could be inserted into one of the UCB sockets. The coprocessor would then perform floating-point operations utilizing the UCB resources. FPDs and FPIDs can be programmed to perform whatever logical functions are required by the coprocessor. For example, if the coprocessor requires a 32-bit operand through specific pins of its package, the UCB FPDs and FPIDs can be programmed to route the operand to these specific pins of the coprocessor. In applications involving analog signals, an analog interface board that includes analog to digital converters and digital to analog converters can be built with an adapter that can be plugged into a UCB socket. The UCB would then be able to process analog signals.

Adapters of various sizes can be built for any chip or system of chips to allow them to interface with the UCB. Larger adapters could also be built which plug into multiple sockets on the UCB. This would allow access to more of the UCB bus lines for applications which need fast (parallel) I/O transfer rates. In addition, smaller adapters could be built to plug into the smaller sockets which hold the UCB RAM chips.

In conclusion, the present invention provides a highly flexible, reconfigurable universal circuit board. The universal circuit board includes a plurality of sockets that can receive field programmable devices, field programmable interconnect devices or selective shorting circuits interchangeably. Optimized interconnection topologies provide for a variety of applications and a reconfigurable interface system provides further flexibility. While the above is a complete description of the preferred embodiments of the present invention, it is possible to use various alternatives, modifications and equivalents. For example, the number of sockets or the interface organization can vary without departing from the inventive concept. Therefore, the scope of the present invention should be determined not with reference to the above description but should, instead, be determined with reference to the appended claims, along with their full scope of equivalents.

What is claimed is:

1. A universal reconfigurable circuit board comprising:
   a plurality of arbitrarily arranged sockets;
   a fixed interconnection network having fixed local buses directly coupling adjacent and non-adjacent pairs of said plurality of arbitrarily arranged sockets and a fixed global bus coupling to all of said plurality of arbitrarily arranged sockets; and
   a fixed interface circuit separate from said plurality of arbitrarily arranged sockets, said interface circuit coupled to said fixed global bus for providing interface to external circuitry,
   wherein, said plurality of arbitrarily arranged sockets and said fixed interconnection network are adapted to enable said plurality of arbitrarily arranged sockets to receive any one of a field programmable device, a field programmable interconnect device, and a selective shorting circuit, and
   wherein, logical reconfigurability of the board is achieved by reprogramming said field programmable device or field programmable interconnect device via said fixed interface circuit, and without making any physical changes to the board.

2. The universal reconfigurable circuit board of claim 1 wherein said field programmable device and said field programmable interconnect device are reprogrammable.

3. The universal reconfigurable circuit board of claim 2 wherein said memory socket is adapted to receive integrated circuit chips other than said memory circuit.

4. The universal reconfigurable circuit board of claim 1 further comprising a memory socket coupled to said interconnection network, said memory socket having a size different than the size of said plurality of arbitrarily arranged sockets.

5. The universal reconfigurable circuit board of claim 1 wherein said interface circuit comprises a first field programmable device coupled to a personal computer bus interface.

6. The universal reconfigurable circuit board of claim 5 wherein said interface circuit further includes a second field programmable device coupled to said first field programmable device and said personal computer bus interface for configuring said first field programmable device.

7. The universal reconfigurable circuit board of claim 6 wherein said first and said second field programmable devices are reconfigurable via said personal computer bus interface.

8. The universal reconfigurable circuit board of claim 1 wherein said interface circuit comprises external connectors coupled to said global bus via input/output buffers.

9. The universal reconfigurable circuit board of claim 1 wherein said interconnection network divides said plurality of sockets into at least two groups, and wherein each socket in a group couples via local buses to all sockets in the other group, but no socket couples via a local bus to other sockets within the same group.

10. The universal reconfigurable circuit board of claim 1 wherein said interconnection network divides said plurality of sockets into at least two groups, and wherein each socket in a group couples via local buses to all other sockets within the same group and a corresponding socket in the other group.

11. The universal reconfigurable circuit board of claim 1 wherein said interconnect network divides said plurality of sockets into at least two groups, and wherein each socket in a group couples via local buses to adjacent sockets within the same group and a corresponding socket in the other group.

12. The universal reconfigurable circuit board of claim 11 wherein each of said plurality of sockets is further adapted to receive adapter circuits for connection to any integrated circuit chip.

13. The universal reconfigurable circuit board of claim 11 wherein each of said plurality of sockets is further adapted to receive adapter circuits for connection to another system.

14. The universal reconfigurable circuit board of claim 11 wherein said plurality of sockets is adapted to receive a single adapter circuit coupling to more than one of said plurality of sockets.

15. The universal reconfigurable circuit board of claim 1 wherein each one of said plurality of sockets is adapted to receive field programmable devices and selective shorting circuits directly and field programmable interconnect devices via an adapter circuit.

16. The universal reconfigurable circuit board of claim 15 wherein said any integrated circuit chip is a microprocessor.

17. The universal reconfigurable circuit board of claim 16 wherein said another system comprises an analog interface board.

18. The universal reconfigurable circuit board of claim 1 wherein said fixed global bus is a 36-bit bus disposed adjacent to said plurality of arbitrarily arranged sockets, and said fixed local buses are 32-bit buses.

19. A universal reconfigurable circuit board comprising:
a plurality of arbitrarily arranged sockets;
a fixed interconnection network having fixed local buses coupling in horizontal, vertical and diagonal directions, selected pairs of said plurality of arbitrarily arranged sockets and a fixed global bus disposed adjacent to said plurality of arbitrarily arranged sockets coupling to all of said plurality of arbitrarily arranged sockets;
a memory socket coupled to selected ones of said plurality of arbitrarily arranged sockets via said fixed interconnection network;
an interface circuit separate from said plurality of arbitrarily arranged sockets, comprising:
a first field reprogrammable device coupled to said fixed global bus and a personal computer bus interface;
a second field reprogrammable device coupled to said personal computer bus interface and said first field reprogrammable device for configuring said first field reprogrammable device; and
external connectors coupled to said fixed global bus via on-board input/output buffers,
wherein said plurality of arbitrarily arranged sockets and said fixed interconnection network are adapted to enable said plurality of arbitrarily arranged sockets to receive any integrated circuit chip including field reprogrammable devices, field reprogrammable interconnect devices, selective shorting circuits, and microprocessors, and
wherein, logical reconfigurability of the board is achieved by reprogramming said field programmable devices or field programmable interconnect devices via said personal computer, and without making any physical changes to the board.

20. The universal reconfigurable circuit board of claim 19 further comprising:
a plurality of memory sockets with each one dedicated to a selected pair of said plurality of arbitrarily arranged sockets; and
a fixed local memory bus coupling said each memory socket to a corresponding fixed local bus.

21. The universal reconfigurable circuit board of claim 20 wherein the size of said memory socket is different than the size of said plurality of arbitrarily arranged sockets.

22. The universal reconfigurable circuit board of claim 19 wherein said external connectors are in the form of a multi-pin nanoconnector.

23. A logically reconfigurable universal circuit board comprising:
an array of arbitrarily arranged sockets;
a plurality of fixed local buses directly coupling selected adjacent and non-adjacent pairs of said array of arbitrarily arranged sockets;
a fixed global bus disposed adjacent to and coupling to every one of said array of arbitrarily arranged sockets;
a plurality of memory sockets with each one dedicated to a selected pair of said array of arbitrarily arranged sockets;
a fixed local memory bus coupling each memory socket to a corresponding fixed local bus; and
a fixed interface circuit separate from said array of arbitrarily arranged sockets, comprising:
a field programmable device coupled to said fixed global bus and adapted to couple to an external personal computer bus for receiving board configuration data,
a plurality of input/output buffers coupled to said fixed global bus and controlled by said field programmable device, and
a multi-pin external connector coupled to said plurality of input/output buffers,
wherein, said array of arbitrarily arranged sockets and said plurality of fixed local buses are adapted to enable said array of arbitrarily arranged sockets to receive any one of a field programmable device, a field programmable interconnect device, and a selective shorting circuit.

* * * * *